(12) United States Patent
Swanson et al.

(10) Patent No.: US 6,787,397 B2
(45) Date of Patent: Sep. 7, 2004

(54) SEMICONDUCTOR DEVICE PROTECTIVE OVERCOAT WITH ENHANCED ADHESION TO POLYMERIC MATERIALS AND METHOD OF FABRICATION

(75) Inventors: Leland S. Swanson, McKinney, TX (US); Elizabeth G. Jacobs, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/426,451

(22) Filed: Apr. 29, 2003

(65) Prior Publication Data

US 2003/0205812 A1 Nov. 6, 2003

Related U.S. Application Data

(62) Division of application No. 09/873,058, filed on Jun. 2, 2001, now Pat. No. 6,580,170.
(60) Provisional application No. 60/213,300, filed on Jun. 22, 2000.

(51) Int. Cl.[7] ............................................... H01L 21/44

(52) U.S. Cl. ....................... 438/118; 438/261; 438/761; 438/762; 438/763; 257/316
(58) Field of Search ................................ 438/261, 761, 438/762, 763; 257/316

(56) References Cited

U.S. PATENT DOCUMENTS

| 5,473,187 A |   | 12/1995 | Baker et al. |
| 6,342,428 B1 |   | 1/2002 | Zheng et al. |
| 6,368,919 B2 | * | 4/2002 | Nuttall et al. ............... 438/261 |
| 6,563,166 B1 | * | 5/2003 | Ni ............................... 257/316 |

* cited by examiner

*Primary Examiner*—David Nelms
*Assistant Examiner*—Mai-Huong Tran
(74) *Attorney, Agent, or Firm*—Wade James Brady, III; Frederick J. Telecky, Jr.

(57) ABSTRACT

An integrated circuit device with a low stress, thin film, protective overcoat having enhanced adhesion both to polymeric materials used in packaging-semiconductor devices, and within the passivating film layers, including the following sequence of materials deposited by PECVD processing: a thin film of silicon dioxide, a layer of silicon nitride, oxy-nitride or silicon carbide, and a very thin topmost layer of silicon oxide.

10 Claims, 3 Drawing Sheets

SEMICONDUCTOR DEVICE PROTECTIVE OVERCOAT WITH ENHANCED ADHESION TO POLYMERIC MATERIALS AND METHOD OF FABRICATION

This application is a divisional application of Ser. No. 09/873,058, filed Jun. 2, 2001 now U.S. Pat. No. 6,580,170, which is a non-provisional application claiming priority from provisional application Ser. No. 60/213,300, filed Jun. 22, 2000.

FIELD OF THE INVENTION

This invention generally relates to a semiconductor device and more particularly to the protective overcoat on an integrated circuit.

BACKGROUND OF THE INVENTION

Typically, integrated circuits (IC) are fabricated on a semiconductor substrate, known as a chip, and the most common substrates are made of silicon. The silicon chip is usually assembled into a package which serves to provide effective enlargement of the distance or pitch between input/output contacts of the chip making it suitable for attachment to a printed circuit board, and to protect the IC from mechanical and environmental damage. Unfortunately, the package intended to provide that protection sometimes contributes to the device failure. Such is the case with some surface mount packages housing VLSI chips in which poor adhesion at the interface between chip and molding compound has caused delamination. A rapid increase in vapor pressure at the delaminated interface, resulting from moisture absorbed by the plastic, and the rapid heat of soldering the package to the printed wiring board causes failures manifested as package cracking, bond wire breakage, and other associated stress related failures.

Recently the semiconductor industry has introduced reduced package sizes, such as those with area array format VS more typical peripheral attach of the input and output (I/O) terminals to a lead frame encapsulated in molded plastic package. These area array assemblies are Chip Scale Packages (CSP)), an example of which is illustrated in FIG. 1, wire bonded or flip chip Ball Grid Array (BGA) packages, and Direct Chip attach (DCA) in which the chip is directly attached to the printed circuit board without use of an intermediate package. Often these area array assembles have solder bumps or balls 11 connected by reflowing the solder from the input/output (I/O) contacts of the chip to a substrate or to the Printed Circuit (PC) Board, making both electrical and mechanical connections. Because the materials of the silicon chip 10 and the substrates or PC board 12 have different coefficients of thermal expansion (CTE), stresses are introduced in the solder connection between the rigid, lower CTE chip and the more compliant, higher CTE PC board. Stresses caused by the thermal expansion mismatch occur during solder reflow, and/or as power to the IC is cycled on and off. The stresses frequently result in mechanical failure of one or more solder joints, and in turn cause electrical failure of the product.

In an attempt to alleviate the solder fatigue failures, and to distribute the thermally induced stresses over a larger area, a polymeric filler or "underfill" encapsulant 15 is introduced in liquid form to surround the solder balls 11, and to fill he cavity between the chip or CSP 10, and the PC board 12. Typically, the underfill is dispensed near the chip edges and flows under the chip and around the solder balls by capillary action. The "underfill" cures to a rigid form via time, temperature, of ultraviolet exposure, or some combination thereof.

The "underfill" process has a number of drawbacks, including but not limited to the following: air pockets or voids 16 being entrapped under the device which can lead to localized stress concentrations, poor adhesion of the underfill to one or more of the surfaces encountered, and a tedious and time consuming process. The viscous underfill compound, most commonly an epoxy resin with inorganic fillers, is introduced methodically and slowly in an attempt to overcome void formation under the chip resulting from poor wetting to the protective overcoat on the chip, the substrate surface and/or the solder bumps.

Adhesion between material surfaces and the effects of poor wetting have long been studied; the controlling factors are recognized as cleanliness, surface tension, and topography, as well as the chemistry of the adherents.

The chip passivation or protective overcoat (PO) of choice for many semiconductor chip manufacturers is silicon nitride, primarily because it has been shown to provide excellent resistance to ingress of mobile ions and contaminants. However, silicon nitride does not provide active sites for adhesion and wetting, and is subject to stress levels which can lead to cracking, and delamination. Stresses vary by deposition techniques, and concerted attempts are made to control the amount of stress, and to provide compressive forces in order to avoid degradation of the chip performance and reliability.

Because of these shortcomings in silicon nitride protective overcoats, the chip manufacturer is frequently forced to apply a patterned film of polyimide atop the protective overcoat. FIGS. 2a and 2b illustrate a polyimide film 22 on a chip 20. The polyimide film 22 is applied in an attempt to provide improved adhesion to polymers used in semiconductor packaging, such as molding compounds 26 in a conventional leaded plastic molded package in FIG. 2b, or to an underfill or potting compound in other types of packages. The polyimide 22 is applied and patterned atop the silicon nitride or other thin film PO (21).

FIG. 2a provides a more detailed view of the surface topography of a chip 20 with a polyimide film 22 patterned over the protective overcoat 21. With respect to adhesion, the polyimide film may have a negative effect if it is sufficiently thick enough to leave a smooth, planar surface. The thin silicon nitride protective overcoat 21 follows the contours of the chip circuitry 24, but the thicker polyimide 22 softens the contours, making a more level surface; such a smooth surface is not ideally suited to optimum adhesion.

Further, while the elastic modulus of polyimide films is higher than typical inorganic films, the thick film coupled with higher thermal expansion does lead to stress on the wafer which can result in warping and/or delamination. Organic films, such as polyimide have neither the desirable high thermal stability, nor the greater thermal conductivity of inorganic films.

Polyimide precursors are applied in liquid form to the surface of a wafer having previously been prepared with an adhesion promoter, or alternately having such a compound included in the polyimide formulation. The polyimide must then be photopatterned. The polyimide formulation may include a photosensitive agent which allows direct patterning, or if it does not, a separate photoresist step is required. Next the film is cured or cross linked by a thermal process. Not only is the polyimide a very expensive compound, but the processing is time consuming, costly, and may negatively impact yield of good chips on the wafer.

Accordingly, a need exists in the industry for a reliable, chip protective overcoat readily wet by, and having good adhesion to polymers, such as molding and underfill compounds, an overcoat which imparts little stress on the chip circuitry, and one which is cost effective in wafer processing.

SUMMARY OF THE INVENTION

It is an object of the current invention to provide a reliable and cost effective chip protective overcoat having good adhesion between the layers, as well as good wetting and adhesion to polymeric materials used in assembly of integrated circuit chips.

It is an object of this invention to provide a manufacturing method for a protective overcoat having enhanced adhesion, and which utilize existing wafer fabrication equipment and materials.

It is further an object of this invention to provide a thermally stable chip protective overcoat which imparts only small and controllable stresses to the active circuits and metallization on the chip.

It is an object of the invention to provide a chip protective overcoat having excellent diffusion barrier properties.

It is also an object of the invention to provide an inorganic chip protective overcoat having improved thermal conductivity, as compared to polymeric coatings.

The objectives of the invention are accomplished by providing a protective overcoat on an integrated circuit device including the following sequence of materials: a thin film of silicon oxide in the range of 5,000 to 10,000 angstroms thickness over the active circuit and metallization, a layer of silicon nitride, oxy-nitride or silicon carbide of about 1,000 to 5,000 angstroms thickness, and a top adhesion layer of silicon oxide in the range of 500 to 5,000 angstroms thickness. This composite overcoat is fabricated by plasma enhanced chemical vapor deposition onto silicon wafers by changing the gas compositions, and process variables in a reactor, but without additional wafer handling. Openings for input/output terminals are photopatterned and etched in the deposited overcoat layers.

The first and third layers of silicon dioxide function to control stresses imparted by the nitride, to provide excellent dielectric properties, and to allow adhesion both between the overcoat layers, and to polymers used in assembly of semiconductor devices. The second layer of a silicon nitride, carbide, or oxy-nitride film is used as a barrier against ingress of mobile ions or contaminants.

The foregoing and other objects, features and advantages of the invention will become more apparent from the following detailed description of a preferred embodiment of the invention which proceeds with references to the accompanying drawings.

DETAILED DESCRIPTION OF THE DRAWINGS

Figure 1:
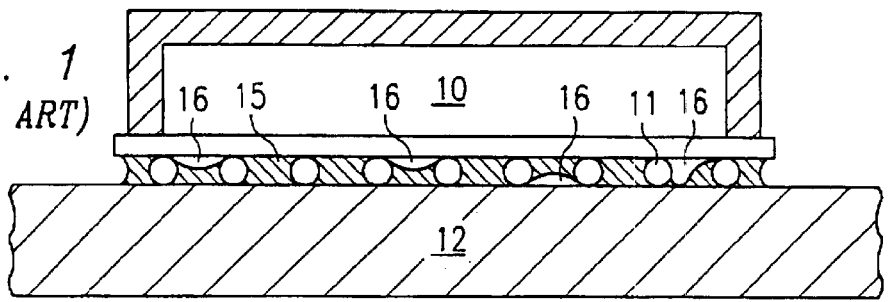
FIG. 1 is a Chip Scale Package with underfill encapsulant. (Prior Art)
Figure 2A:
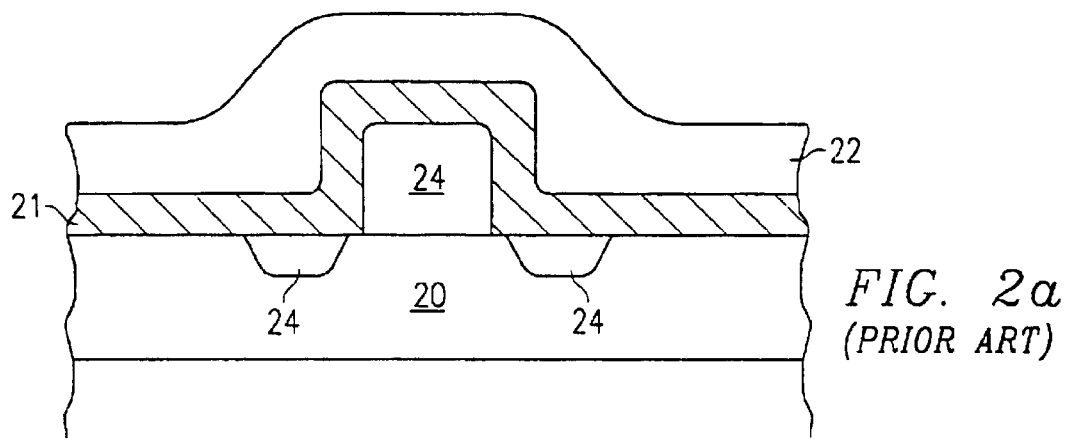
FIG. 2a illustrates a chip surface having a polyimide adhesion layer over protective overcoat. (Prior art)
Figure 2B:
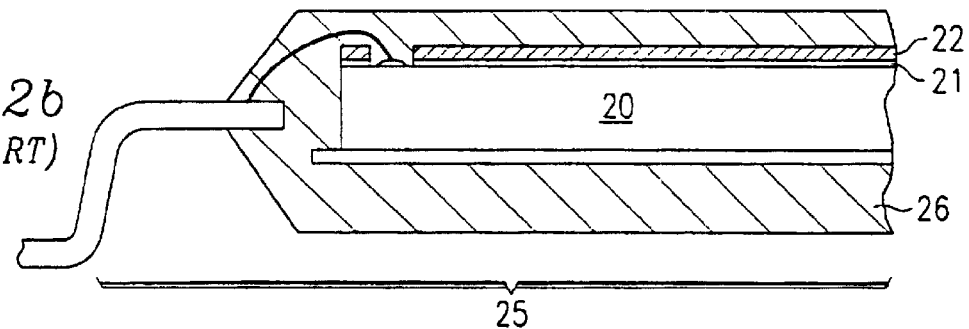
FIG. 2b is a leaded plastic package housing a semiconductor device with polyimide coating. (Prior art)
Figure 3:
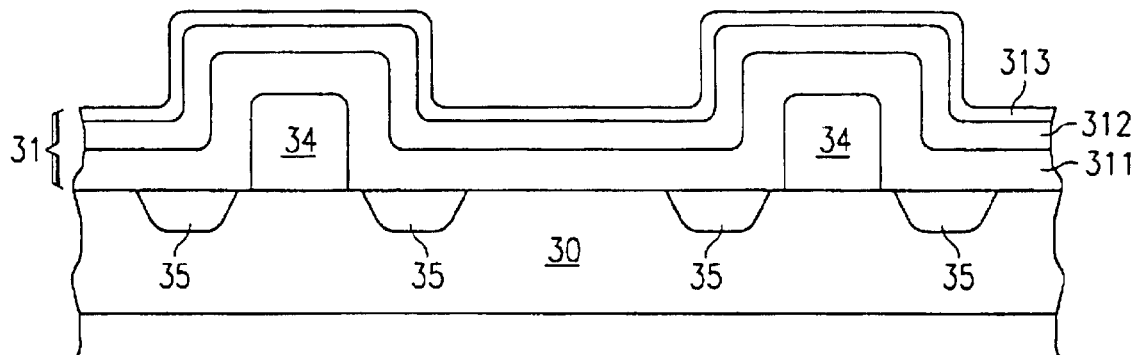
FIG. 3 shows the successive protective overcoat layers of current invention.

FIG. 3 provides a cross sectional view of a portion of a semiconductor chip 30 having the protective overcoat structure 31 of the current invention. A number of novel features contribute to a reliable, high performance device having good adhesion both between the multiple dielectric layers of the protective overcoat, and to polymeric materials used in packaging the chip. In FIG. 3, device circuitry including metal interconnect lines 34, and buried structures 35 are covered by a passivation or protective overcoat (PO) 31 including the following thin film layers formed in succession; a film of silicon dioxide 311, a second dielectric layer 312 of a silicon compound, preferably silicon nitride, or alternately silicon oxy-nitride or carbide, and a very thin final or topmost layer of silicon dioxide 313. The layers are patterned with openings as required for external contact or other device requirements (not shown).

Dielectric material layers usually function to provide electric insulation between conductive layers, and to protect underlying structures of the integrated circuit against contaminants. Additionally, the provision of successive layers ensures protection for the device even when any one of the layers becomes damaged, e.g., by the formation of small cracks. Therefore, it is important that no regions be allowed to have less than perfect adhesion between the overlaid layers.

The first layer 311 is silicon dioxide in the range of 5,000 to 10,000 angstroms thickness. The term silicon dioxide refers to a not strictly stoichiometric silicon oxide, i.e., $Si[x]O[2-x]$. This layer serves both to mitigate stresses of the silicon nitride, or second layer of the protective overcoat structure 31, and to provide an excellent dielectric passivation for the device circuitry. The silicon dioxide as both the first 311 and third 313 layers provide adhesion to the middle or barrier 312 layer. Further, the first layer of silicon dioxide imparts little to no tensile stress on the circuitry or metallization of the chip, and serves to decouple stress from the silicon nitride layer to the underlying circuitry.

In a preferred embodiment, a silicon nitride or barrier layer 312 provides excellent protection against mobile ions, moisture and other contaminants, which in combination with the oxide layers 311, 313 is equal to thicker nitride overcoats of existing technology. In the current invention, a thickness of 1,000 to 5,000 angstroms is adequate for the barrier or second layer.

In a second embodiment, the second layer of the protective overcoat 312 is a silicon oxy-nitride, and in yet a third embodiment, the second layer is silicon carbide. Oxy-nitrides are preferable in specific device types where selected light transmission is necessary. Silicon carbide is well known for having very high thermal conductivity, and as a PO layer serves both to spread localized heat generated by the circuits across the surface of the chip, and to provide a means to transport heat away from the circuits to the outside world. Techniques have been developed for providing thin films of silicon carbide which have both excellent barrier characteristics, and the stresses are readily controllable by the deposition parameters.

The silicon compounds selected for the second or barrier layer refer not strictly to stoichiometric formulations, but instead to mixtures comprising substantially the stated compound, and the mixture as understood within the industry.

The third or topmost oxide layer is key to adhesion of the overcoat to polymeric materials. Only a very thin film of oxide, in the range of 500 to 5,000 angstroms is required to provide active sites for adhesion to the underlying nitride, and to provide an exposed surface having low surface tension and active sites for wetting and adhesion to polymers and oxides of silicon, such as epoxies used in underfill and plastic molding compounds. Oxides of silicon, e.g., Si—$O_x$, Si—OH and silane reaction products in various forms are well recognized by those skilled in the art as adhesion promoters for polymers such as epoxies used in underfill and plastic molding compounds. (U.S. Pat. No. 5,795,821 and U.S. Pat. No. 5,418,189.

As previously noted, controlling factors for wetting and adhesion between materials are recognized as cleanliness, surface tension, and topography, as well as the chemistry of the adherents.

From FIG. 3, it can be noted that the thin film enhanced adhesion overcoat 31 follows the topography of the underlying circuit structures, thereby providing an exposed surface having an irregular texture. It has long been recognized that adhesion is enhanced by a rough or textured surface, as opposed to a smooth, planar surface.

Figure 4A:
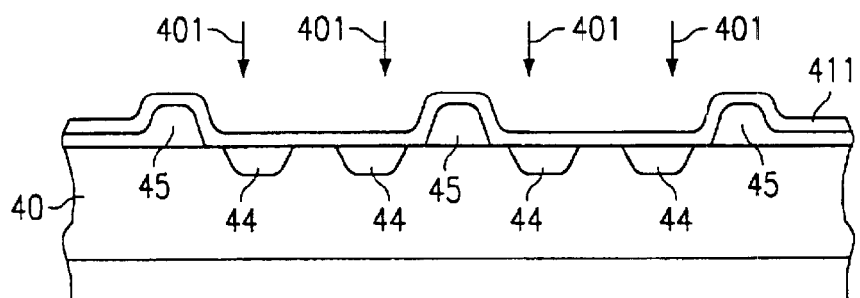
FIG. 4 illustrates the process flow for the enhanced adhesion protective overcoat of the current invention.
Figure 4B:
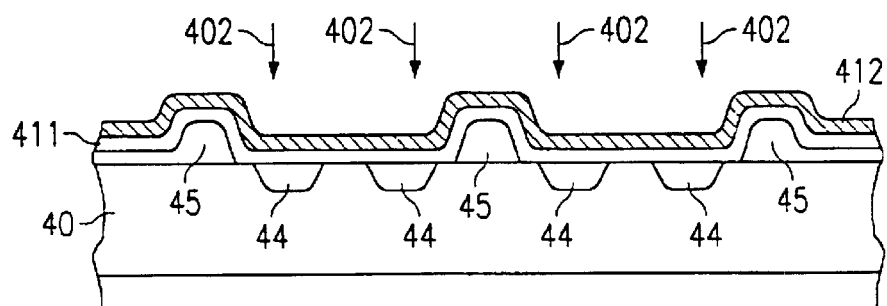
Figure 4C:
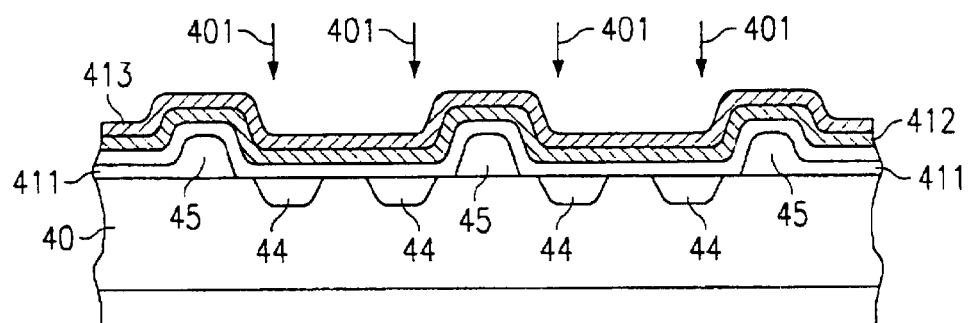
Figure 4D:
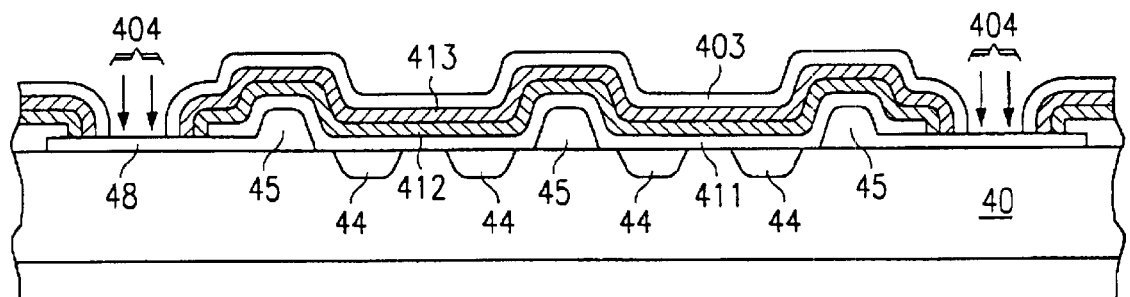

A significant advantage of the adhesion enhanced protective overcoat is afforded by compatibility of the process with known wafer processing technology, and automation used throughout the industry. FIGS. 4a through 4d illustrate the steps for fabrication of an overcoat 31, such as that illustrated in FIG. 3. In FIG. 4a a silicon wafer 40 having integrated circuits 44 patterned, including the topmost metal interconnection 45 level are positioned in a plasma enhanced chemical vapor deposition chamber. Using a standard PETEOS (plasma enhanced tetra ethyl ortho silicate) process designated by arrows 401, an oxide film 411 in the range of 5,000 to 10,000 angstroms thick is deposited. In a more detailed view in FIG. 4b, the gas source is changed to include silane and nitrogen and/or ammonia with the PECVD process designated by arrows 402 to deposit a film of silicon nitride 412 in the range of 1,000 to 5,000 angstroms thick. The nitrogen sources are removed, and in FIG. 4c a final thin layer of oxide 413 is added using a standard PETEOS process 401. The wafer is removed from the chamber, photoresist 403 is applied and photopatterned to expose bond pads 48 and/or other openings required by the device. The pattern is preferably etched using a gaseous dry etching process 404 to remove the protective overcoat layers from the bond pads, and other openings on the device. Alternately, wet etching with buffered hydrofluoric acid is used to etch the PO.

Fabrication of the second embodiment, a device having protective overcoat layers or silicon dioxide, silicon oxynitride, and silicon dioxide differs from that described above in that oxygen is introduced along with nitrogen, silane, and ammonia curing the deposition process for the second layer. The processes for silicon oxy-nitride are known and used throughout the industry, in particular for EPROM devices. Processes for the first and third layers of the overcoat are unchanged from that described above.

Fabrication of protective overcoat of the third embodiment including a layer of silicon dioxide, silicon carbide, and silicon dioxide differs from the first embodiment in that silane/methane, trimethylsilane, tetramethylsilane, or other organosilane gas is the source gas, along with Ar or He as a carrier gas, for the second layer of silicon carbide. Again the first and third layers are of silicon dioxide using the PETEOS process.

Each of the processes for deposition and patterning is well known throughout the semiconductor industry, and the equipment is widely used. The combined successive processes form a unique PO structure having enhanced adhesion to polymers used in IC package assembly, as well as good adhesion between the film layers, and having minimal stresses on the circuits, thereby providing a strong, low defect, chip passivation.

Plasma enhanced chemical vapor deposition (PECVD) of successive overcoat layers eliminates excessive wafer handling by sequentially depositing layered films in a single chamber. Processes employing plasma enhanced chemical vapor deposition provide clean, uncontaminated surfaces between the layers as a function of the atmospheric control within the chamber, thus facilitating adhesion between the multiple layers. Further, PECVD optimizes process cycle time by successive depositions without handling, and by a single photopatterning step to etch openings.

The completely inorganic overcoat of the current invention not only provides device performance advantages of enhanced adhesion to packaging polymers, but also has very high temperature stability, in excess of 450 degrees C., and has improved thermal conductivity as compared to existing enhanced surface adhesion PO technology. In particular the embodiment having a silicon carbide second or barrier layer provides good thermal conductivity, and is applicable to high power circuits.

Figure 5:
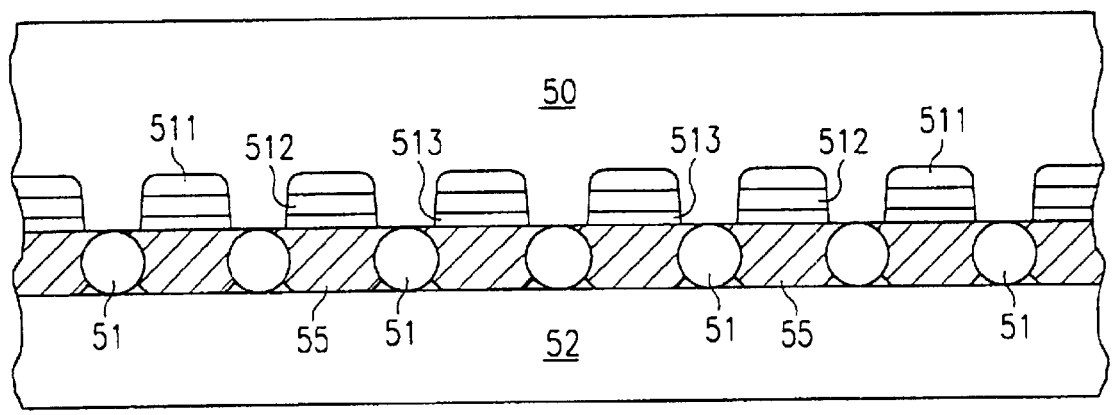
FIG. 5 is a flip chip assemblage having enhanced adhesion between PO and the underfill material.

FIG. 5 illustrates a flip chip assemblage of the current invention. An integrated circuit device 50 having sequentially deposited protective overcoat of silicon dioxide 511, silicon nitride 512, and silicon dioxide 513 is attached to a substrate 52 using solder balls 53. A polymeric underfill compound 55 is completely wetted to the oxide surface 513 of the protective overcoat, and no voids resulting from poor adhesion are present in the underfill.

Figure 6:
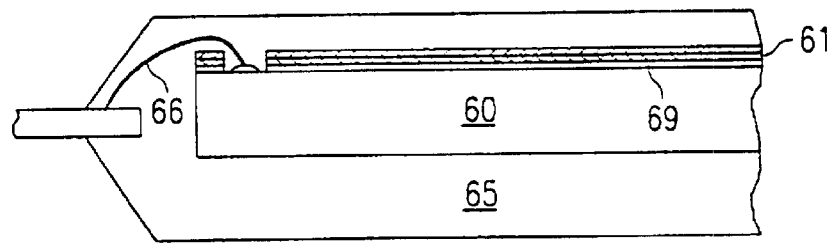
FIG. 6 is a molded semiconductor device of the current invention.

An alternate embodiment is illustrated in FIG. 6 in a cross sectional view of a leaded plastic molded package, wherein the multilayer protective overcoat 61 of the current invention has enhanced adhesion to the molding compound 65. This adhesion is particularly advantageous at the corners of chip 69 where delamination of the plastic can cause shearing of the chip metal structures and/or fatigue of the bond wires.

While the invention has been described in connection with several preferred embodiments, it is not intended to limit the scope of the invention to a particular form set forth, but on the contrary, it is intended to cover alternatives, modifications and equivalents as may be included within the spirit and scope of the invention as defined by the appended claims.

What is claimed is:

1. A method of forming a semiconductor device having a protective overcoat with enhanced adhesion both to polymeric materials used in packaging and between the layers of said overcoat, the method including the following steps:

positioning at least one semiconductor wafers including fabricated integrated circuits into a plasma deposition reactor, evacuating the chamber prior to deposition and depositing a silicon dioxide layer using a PETEOS (plasma enhanced tetraethyl ortho silicate) process, changing the gas supply in the chamber to include a silane, nitrogen and ammonia, using a PECVD (plasma enhanced chemical vapor deposition) process depositing on said silicon dioxide layer a layer of silicon nitride thinner than said silicon dioxide layer, changing the gas supply in the chamber to deposit a film of silicon dioxide on said layer of silicon nitride which is thinner than said silicon dioxide layer using a PETEOS process, and applying a photoresist, photopatterning the bond pads and/or other openings, and etching the openings in the protective overcoat using a dry etch process.

2. The method of claim 1 wherein the layer of silicon dioxide is from about 5000 to about 10,000 angstroms, the layer of silicon nitride is from about 1000 to about 5000 angstroms and the thin film of silicon dioxide is from about 500 to about 5000 angstroms.

3. A method of forming a semiconductor device having a protective overcoat with enhanced adhesion both to polymeric materials used in packaging and between the layers of said overcoat, the method including the following steps:

positioning at least one semiconductor wafers with fabricated integrated circuits into a plasma deposition reactor, evacuating the chamber prior to deposition and the depositing on said at least one semiconductor wafer a silicon dioxide layer using a PETEOS (plasma enhanced tetraethyl ortho silicate) process, changing the gas supply in said chamber to include a silane, nitrogen, oxygen and ammonia, using a PECVD (plasma enhanced chemical vapor deposition) process depositing a layer of silicon oxy-nitride thinner than said silicon dioxide layer, changing the gas supply in said chamber to deposit a thin film of silicon dioxide thinner than said silicon dioxide layer using a PETEOS process, and applying a photoresist, photopatterning the bond pads and/or other opening, and etching the openings in the protective overcoat using a dry etch process.

4. The method of claim 3 wherein the layer of silicon dioxide is from about 5000 to about 10,000 angstroms, the layer of silicon nitride is from about 1000 to about 5000 angstroms and the thin film of silicon dioxide is from about 500 to about 5000 angstroms.

5. A method of forming a semiconductor device having a protective overcoat with enhanced adhesion both to polymeric materials used in packaging and between the layers of said overcoat, the method includes the following steps;

evacuating the chamber prior to deposition and depositing of a silicon dioxide layer using a PETEOS (plasma enhanced tetraethyl ortho silicate) process, changing gas supply in the chamber to include silane/methane, or an organosilane, such as trimethyl or tetramethyl silane, using a PECVD (plasma enhanced chemical vapor deposition) process depositing a layer of silicon carbide on the silicon dioxide layer thinner than the silicon dioxide layer, changing the gas supply in the chamber and depositing on the silicon carbide layer a thin film of silicon dioxide thinner than the silicon dioxide layer using a PETEOS process, and applying a photoresist, photopatterning the bond pads and/or other opening, and etching the openings in the protective overcoat using a dry etch process.

6. The method of claim 5 wherein the layer of silicon dioxide is from about 5000 to about 10,000 angstroms, the layer of silicon nitride is from about 1000 to about 5000 angstroms and the thin film of silicon dioxide is from about 500 to about 5000 angstroms.

7. A method of forming a semiconductor device having an enhanced adhesion protective overcoat, the overcoat being fabricated by the steps of:

providing a first layer of silicon dioxide;

providing a second layer of a silicon compound selected from the group consisting of one of silicon nitride, silicon carbide or silicon oxynitride; and providing a third layer comprising a very thin film of silicon dioxide, the first layer being thicker than the second layer and the third layer being thinner than the first layer, the first layer relieving stresses imposed by the second layer and the third layer being an adhesion promoter between the second layer and a subsequently applied material.

8. The method of claim 7 further including the step of providing an underfill polymer in contact with said thin layer of silicon dioxide.

9. The method of claim 8 wherein the layer of silicon dioxide is from about 5000 to about 10,000 angstroms, the layer consisting of one of silicon nitride, silicon carbide or silicon oxynitride is from about 1000 to about 5000 angstroms and the thin film of silicon dioxide is from about 500 to about 5000 angstroms.

10. The method of claim 7 wherein the layer of silicon dioxide is from about 5000 to about 10,000 angstroms, the layer consisting of one of silicon nitride, silicon carbide or silicon oxynitride is from about 1000 to about 5000 angstroms and the thin film of silicon dioxide is from about 500 to about 5000 angstroms.

* * * * *